(12) United States Patent
Koyama (10) Patent No.: US 8,189,360 B2
(45) Date of Patent: May 29, 2012

(54) SEMICONDUCTOR MEMORY DEVICE (75) Inventor: Haruhiko Koyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 265 days.

(21) Appl. No.: 12/725,640

(22) Filed: Mar. 17, 2010

(65) Prior Publication Data

US 2010/0329012 A1     Dec. 30, 2010

(30) Foreign Application Priority Data

Jun. 30, 2009   (JP) .................. 2009-155390

(51) Int. Cl.
   *G11C 5/02*      (2006.01)
   *G11C 5/06*      (2006.01)
   *G11C 16/04*     (2006.01)
   *H01L 29/788*    (2006.01)
(52) U.S. Cl. ........ 365/63; 365/51; 365/185.17; 257/316
(58) Field of Classification Search ............ 365/63
   See application file for complete search history.

(56) References Cited

U.S. PATENT DOCUMENTS

| | | | | |
|---|---|---|---|---|
| 5,148,246 A * | 9/1992 | Ema | ................... | 257/316 |
| 5,401,990 A * | 3/1995 | Nakagawara | ............ | 257/231 |
| 7,126,835 B2 * | 10/2006 | Takahashi et al. | ............ | 365/63 |
| 7,446,418 B2 * | 11/2008 | Watanabe | ............ | 257/758 |
| 7,613,022 B2 * | 11/2009 | Murakami | ............ | 365/63 |
| 7,885,114 B2 * | 2/2011 | Park et al. | ............ | 365/185.17 |
| 2009/0096018 A1 * | 4/2009 | Izumi | ............ | 257/328 |

FOREIGN PATENT DOCUMENTS

| | | |
|---|---|---|
| JP | 7-202143 | 8/1995 |
| JP | 9-181273 | 7/1997 |
| JP | 2002-329783 | 11/2002 |

* cited by examiner

*Primary Examiner* — Son Mai
(74) *Attorney, Agent, or Firm* — Oblon, Spivak, McClelland, Maier & Neustadt, L.L.P.

(57) ABSTRACT

A semiconductor memory device includes first and second element regions having a rectangular bent portion and a pair of straight line portions connected to both ends of the bent portions, respectively. The pair of straight line portions extends in an opposite direction each other along a first direction. A first element region is arranged in parallel with the second element region so that the first and second element regions are isolated by an element isolation region, and the first and second bent portions are arranged along a second direction in which the first direction intersects with the second direction at an acute angle. A select gate line connected to select transistors extends in the second direction. A plurality of word lines connected to the memory cells are arranged in parallel with the select gate line in an opposite side of the bent portions with respect to the select gate line.

17 Claims, 6 Drawing Sheets

SEMICONDUCTOR MEMORY DEVICE

CROSS-REFERENCE TO RELATED APPLICATION

This application is based upon and claims the benefit of priority from prior Japanese Patent Application No. 2009-155390, filed Jun. 30, 2009, the entire contents of which are incorporated herein by reference.

BACKGROUND OF THE INVENTION

1. Field of the Invention

The invention relates to a semiconductor memory device having a widened contact area.

2. Description of the Background Art

A NAND flash memory is known as one of non-volatile semiconductor memories in which data can be electrically restored (EEPROM, Electrically Erasable and Programmable Read Only Memory) among semiconductor memory devices. In the NAND flash memory, a plurality of memory cells ($2^n$ memory cells, such as 32 memory cells, 64 memory cells, etc.) are connected in series to constitute a NAND memory cell unit (NAND string).

The NAND string has an element region in which source/drain diffusion layers are formed alternately so as to sandwich a channel region on a surface of a well layer formed on a semiconductor substrate. A side face of the element region along the NAND string is electrically separated by an element isolation region.

Select gate transistors (hereinafter referred to as select transistors) are arranged at both ends of the NAND string so as to selectively connect the NAND string to either a bit line or a source line. Each control gate of the memory cell in the NAND string is connected in a word line direction, and forms a word line. The gate of the select transistor is a portion of a select gate line in parallel with the word line. The bit line intersects with the word line at a right angle, and is arranged in parallel with the element region.

Since adjacent memory cells of the NAND string share a source/drain diffusion region, the NAND flash memory has a smaller unit cell size than other cell array types. Therefore, the NAND flash memory can have a large capacity. Further, the width of the element region, the width of the element separation region, the word line, and the like have been generally disposed by a line/space (hereinafter referred to as L/S) of the minimum processing size F (Feature Size).

The select transistors on both ends of the NAND string are required to suppress short channel effect and have controllability of threshold voltages. For example, even when the width of the element region and the word line is formed with the minimum processing size F, the select gate line generally has a wide width.

The bit line is connected with the element region formed with the width of the minimum processing size via a contact plug. As the capacity becomes larger, the minimum processing size F becomes smaller. As a result, the positional displacement relatively becomes larger, which makes it difficult to connect the element region and the contact plug. Even if there is no displacement, the contact area inevitably decreases, and there is a potential problem in that the contact resistance increases.

For example, Japanese Patent Application Laid-Open No. 1995-202143 discloses a semiconductor memory device in which the positions of contact plugs are alternately shifted in the bit line direction, namely, in a direction of a fringe region. In case of the contact plugs are arranged in a zigzag manner, the distance to the contact section of an adjacent element region can be ensured, and the breakdown voltage between the NAND strings can also be ensured. The bit line of the disclosed semiconductor memory device has a fringe at a connecting portion with the contact plug.

Since the disclosed contact plugs of the semiconductor memory device are arranged to be alternately shifted in the direction of the element region, a widened portion similarly to the bit line may be arranged at a contact area with the element region so that the contact area increases in order to suppress the increase of the contact resistance. In such case, however, it is necessary to space apart adjacent element regions by at least the distance equivalent to the widened width of the element regions. Therefore, there is a problem in that the element region other than the widened portion is formed larger than the minimum processing size F, and further, in case of the control gate (word line) and the select gate line are arranged in accordance with the zigzag of the contact plugs in order to improve the uniformity of the cell characteristics, there is no choice but to increase the distance between the control gates and the like.

BRIEF SUMMARY OF THE INVENTION

A semiconductor memory device according to one aspect of the invention includes a semiconductor substrate; a first element region disposed on the semiconductor substrate including a first bent portion formed of a rectangular region, and a pair of first straight line portions connected to opposite both ends of the first bent portion respectively, extending in an opposite direction each other along a first direction, a width of the pair of first straight line portions being less than the width of the first bent portion; a second element region disposed on the semiconductor substrate including; a second bent portion formed of a rectangular region, and a pair of second straight line portions connected to opposite both ends of the second bent portion respectively, extending in an opposite direction each other along the first direction, and wherein a width of the pair of second straight line portions being less than the width of the second bent portion, and the first and second element regions are disposed so as to interpose an element isolation region having Feature Size Line Space therebetween, and the first and second bent portions are disposed along a second direction with an acute angle with respect to the first direction; contact plugs connected to respective first and second bent portions; first and second select transistors disposed in the first and second element regions respectively, adjacent to the contact plugs; select gate lines connected to the first and second select transistors extending in the second direction; and a plurality of word lines commonly connected to the memory cells in the first and second element regions, the word lines extending in the second direction in parallel with the select gate lines on an opposite side of the bent portion with respect to the select gate line.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A semiconductor memory device according to an exemplary embodiment of the present invention will now be described with reference to the accompanying drawings wherein the same or like reference numerals designate the same or corresponding parts throughout the several views.

First Embodiment

A semiconductor memory device according to a first embodiment of the invention will be described with reference to FIGS. 1 to 3.

Figure 1:
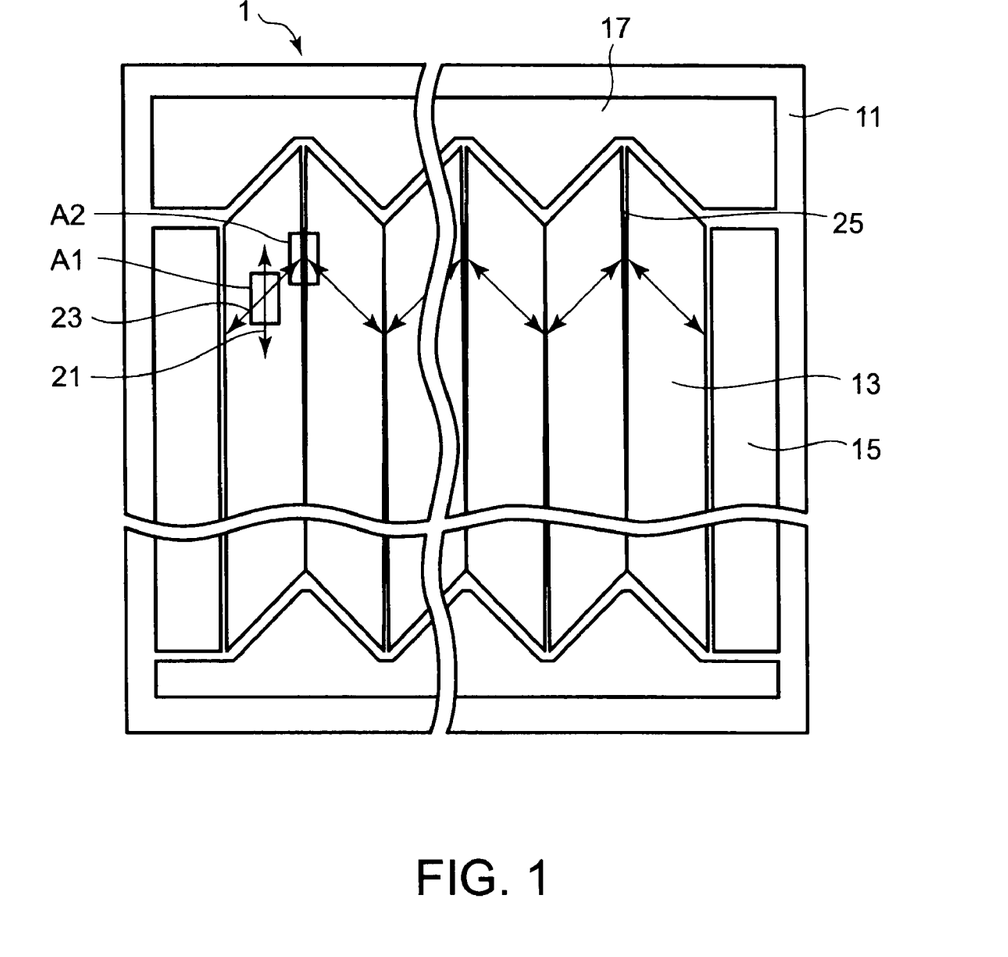
FIG. 1 is a plan view schematically showing a structure of a semiconductor memory device according to a first embodiment of the invention.

As shown in FIG. 1, a semiconductor memory device 1 has a parallelogram memory cell region 13. The memory cell region 13 is structured in a symmetrical manner with respect to a plane along a element region direction 21 (column direction). In other words, the memory cell region 13 is bent back in a row direction to make a larger cell array. Word lines are formed along a shorter side of the parallelogram, namely, along a word line direction 23. The element region direction 21 and the word line direction 23 intersect with each other at an angle of 45 degrees. The shorter side of the memory cell region 13 in the element region direction 21 is formed so as to be in parallel with the word line direction 23, inclining with at an angle of 45 degrees from the element direction 21 and row line direction, respectively. Since the memory cell region 13 is structured in a symmetrical manner with respect to a plane along an element region direction 21, substantially triangle spaces are formed in the end portions of the adjacent memory cell regions 13.

The bent back position is, for example, an array adjustment region 25 that does not serve as a memory cell. One both ends of the bent back memory cell region 13 are arranged with a row circuit 15 including a row decoder and the like, which is connected to the memory cell region 13. The other both ends are arranged with a column circuit 17 and the like including a sense amplifier and the like, which is connected to the memory cell region 13. The column circuit 17 may be disposed in the space in a substantially triangle shape, which is disposed in the end portions of the memory cell regions 13. The row circuit 15 and the column circuit 17 may also have other circuits such as peripheral circuits. It should be noted that the semiconductor memory device 1 may have a plurality of sets of the memory cell array, the row circuit 15, and the column circuit 17.

Figure 2A:
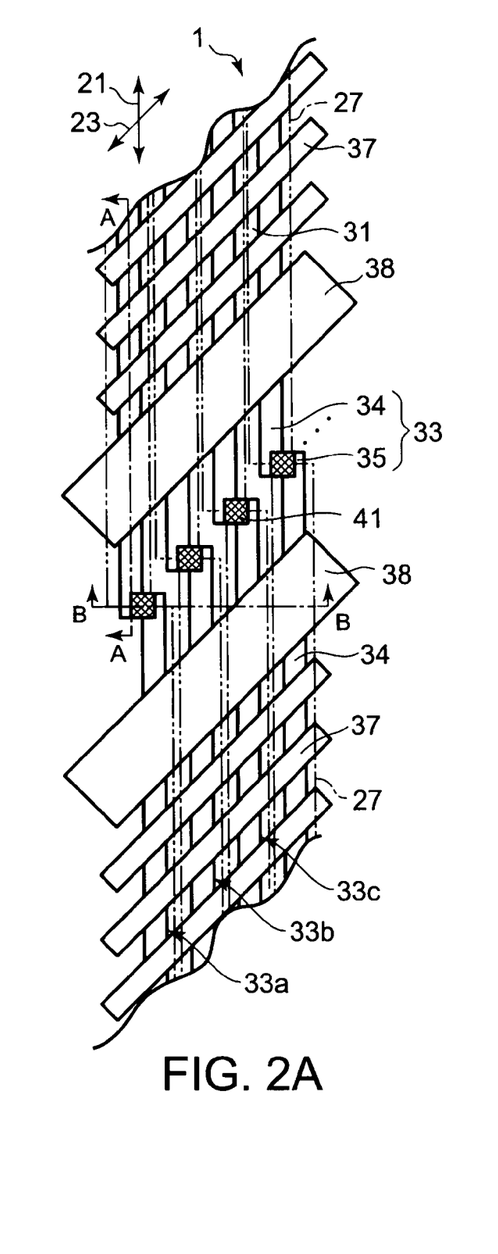
FIG. 2A is an enlarged plan view showing a portion of a region A1 of FIG. 1 and schematically shows a structure of a memory cell region of a semiconductor memory device according to the first embodiment of the invention.
Figure 2B:
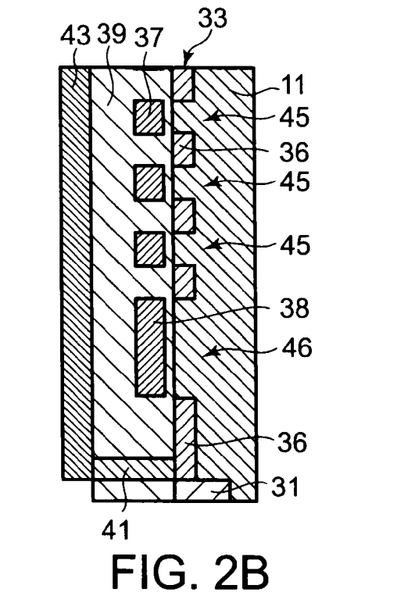
FIG. 2B is a cross sectional view taken along a line A-A of FIG. 2A.
Figure 2C:
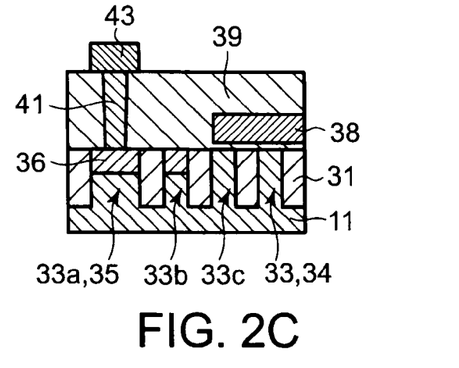
FIG. 2C is a cross sectional view taken along a line B-B of FIG. 2A.
Figure 2D:
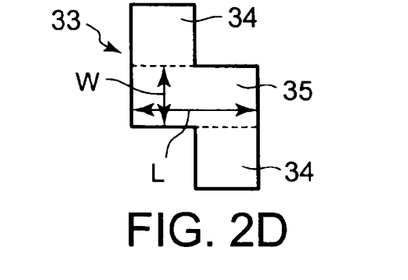
FIG. 2D is an enlarged plan view of a bent section of FIG. 2A.
Figure 3:
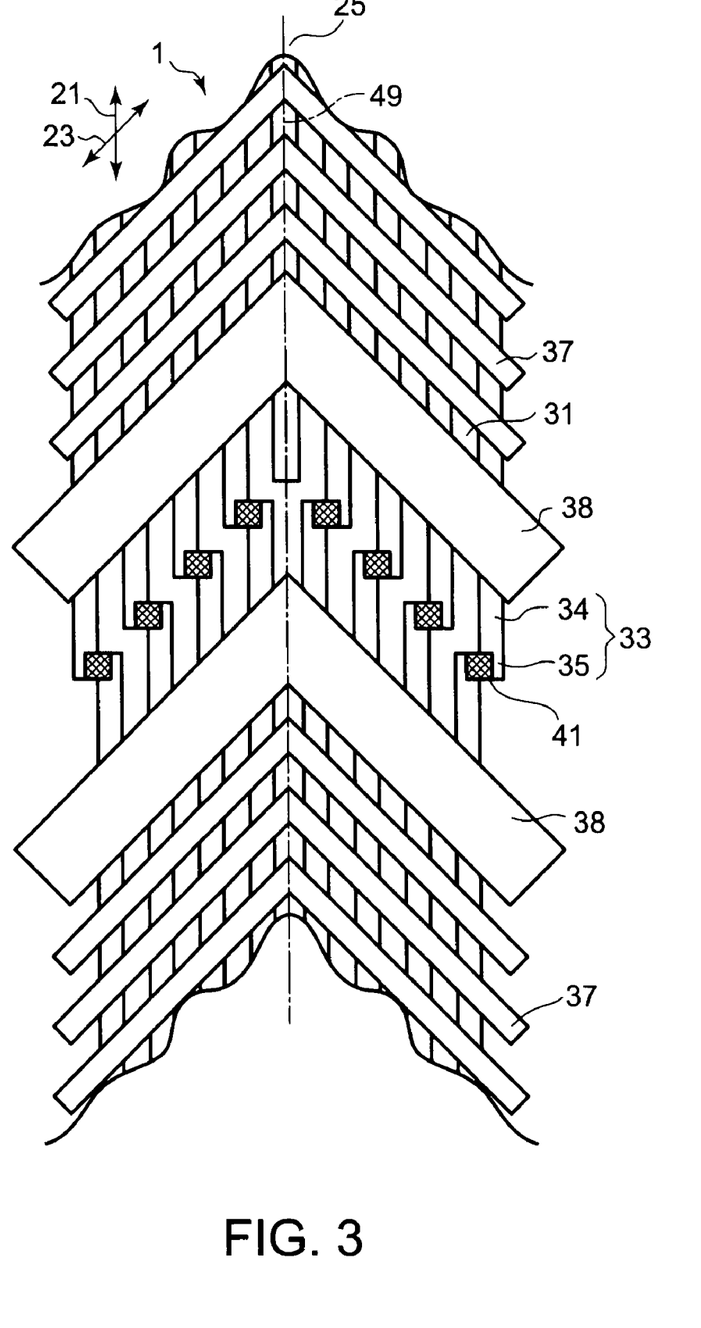
FIG. 3 is an enlarged plan view schematically showing a portion of a memory cell region A2 of the semiconductor memory device shown in FIG. 1 according to the first embodiment of the invention.

FIG. 2A shows a plan view corresponding to a region A1 of FIG. 1. FIG. 2B shows a cross section taken along a line A-A of FIG. 2A, and FIG. 2C shows a cross section taken along a line B-B of FIG. 2A. FIG. 2D shows an enlarged view of a bent portion 35 of FIG. 2A. In the plan view of FIG. 2A, for the sake of convenience, an insulating film 39 and a bit line 43 shown in FIG. 2B and FIG. 2C are illustrated as being removed so as to expose element regions 33, 33a, 33b, 33c, a contact plug 41, and the like. The bit line 43 has substantially the same plane shape as the element region 33, and is arranged on the element region 33 via the insulating film 39 so as to overlap the element region 33 in the plan view.

As shown in FIGS. 2A and 2B, a NAND string 27 constituting a NAND memory cell unit is straightly arranged in the element region direction 21. A portion of a word line 37 formed on a charge accumulation layer (not shown) serves as a gate electrode of each non-volatile memory cell 45, and the non-volatile memory cells 45 are disposed in series with a diffusion region 36 interposed between adjacent non-volatile memory cells 45. Both ends of the memory cells 45 connected in series are connected to select transistors 46 in series via the diffusion regions 36. A portion of a select gate line 38 serves as a gate electrode of the select transistor 46. The select transistor 46 on one end, i.e., on a drain side, is connected to the bit line 43, which is a data transmission line, via the contact plug 41. The select transistor on the other end, i.e., on a source side, is connected to the source line, which is not shown in the figure. The NAND string 27 is constituted by 64 memory cells 45, for example, but a dummy memory cell can be arranged between the memory cell 45 and the select transistor 46.

Further, as shown in FIG. 2D, the semiconductor memory device 1 has a bent portion 35 (length L, width W) made of a diffusion layer. The element regions 33a are shifted from each other in the row direction by half the distance L at the bent portion 35, and extend in the opposite directions along the element region direction 21. The bent portion 35 is similarly disposed for each of the element regions 33b, 33c adjacent to the element regions 33a. The adjacent element regions are separated by a element isolation region 31. The bent portion 35 is arranged between the adjacent select gate lines 38 disposed along the word line direction 23. The select transistor 46 includes the select gate line (gate electrode) 38 and the diffusion region 36. The diffusion region 36 is connected to the bit line 43 on the insulating film 39 via the contact plug 41. On the opposite side of the bent portion 35 with respect to the select gate line 38, a plurality of word lines 37 are arranged in parallel with the select gate line 38 in the word line direction 23. The memory cell transistors are formed in respective regions at which the element regions 33a, 33b, 33c intersect with the respective word lines 37.

As shown in FIGS. 2B and 2C, a semiconductor substrate 11 is a silicon substrate having a P-type well. The element regions 33 and the element isolation regions 31 are alternately formed on the surface of the semiconductor substrate 11 with the L/S of the minimum processing size F along the element region direction 21.

As shown in FIG. 2D, the bent portion 35 is in a substantially rectangular shape, and has a length (L) extending in a direction (row direction) perpendicular to the element region direction 21 and a width (W) along the element region direction 21. A pair of straight line portions 34 of the element region 33 connected to one lengthwise end and the other lengthwise end of the bent portion 35 extends in the opposite directions from each other along the element region direction 21. The bent portion 35 has the length (L) that is twice the minimum processing size F, and the width (W) that is the minimum processing size F. In case of the length (L) of the bent portion 35 is twice the minimum processing size F, the bent portion 35 can be easily brought into contact with the contact plug 41 even where a displacement of positioning in the lengthwise direction of the bent portion 35 occurs.

The bent portion 35 is at a connection position of the two NAND strings 27 extending in the element region direction 21. In other words, the bent portion 35 is at the middle of the adjacent select gate lines 38. Further, the two NAND strings 27 sharing the bent portion 35 are displaced from each other by the minimum processing size F in the row direction.

In the element region 33, the diffusion regions 36 doped with N-type impurity serving as source/drain are cyclically formed in the P-type well. In other words, in the plan view, the P-type well region is formed on the front surface of the semiconductor substrate 11 under the word line 37, and the N-type diffusion region 36 is formed between the adjacent word lines 37. Further, the P-type well region and the N-type diffusion layer region 36 as a part of the adjacent bent portions 35 are formed on the surface of the semiconductor substrate 11 under the select gate line 38 (gate electrode).

The element isolation region 31 is disposed so that the interval in the row direction of the two adjacent element regions 33 is the minimum processing size F. The element isolation region 31 has a trench structure (STI, Shallow Trench Isolation) in which the surface of the semiconductor substrate 11 is dug down, and the element isolation region 31 is an insulating film made of a silicon oxide film, for example. The element isolation region 31 has a bent section corresponding to the bent portion 35, and is disposed along the element region 33.

In each of the NAND strings 27, the plurality of word lines 37 extend in parallel with the word line direction 23 between the two select gate lines 38, and are arranged with the L/S. The width of the word line 37 is the minimum processing size F, and the width of the select gate line 38 in the same direction is several times larger than the minimum processing size F, for example about two to ten times the minimum processing size F. The word line 37 connects the gate electrodes of the cell transistors of the adjacent NAND strings 27 in the word line direction 23.

The element region 33 and the word line 37 are formed to have a width of substantially the minimum processing size F. The direction of the element region 33 is inclined by about 45 degrees from the direction of the word line 37. Therefore, in the plan view, the shape of the overlapping section is substantially in a rhombic shape. In addition, the overlapping portion of the element separation region 31 and the word line 37 is also substantially in the rhombic shape, and the shapes of the element isolation region 31 and the element region 33, being seen from above through a gap between the adjacent word lines 37, are also substantially in the rhombic shape. The element region 33 has a structure in which the P-type well regions and the diffusion regions are alternately arranged.

The drain side of the NAND string 27, i.e., the bent portion 35, is connected to the bit line 43 functioning as the data transfer line. In other words, the contact plugs 41 connected to the element region 33 are individually formed. The contact plugs 41 are formed without being in contact with each other. The more minute the contact plug 41 is, the more difficult the production becomes. On the other hand, the source side, not shown in the drawings, can electrically connect the NAND strings 27 adjacent in the word line direction 23 with each other. Therefore, it is not necessary to form the contact plugs that are not individually in contact with the element region 33, and as a result, the production is relatively easy. Thus, the source side does not necessarily require the bent section.

The contact plug 41 is formed on the surface of the semiconductor substrate 11 substantially perpendicular to the surface, and is aimed to be formed in a central portion of the bent portion 35 of the element region 33. The contact plug 41 is formed by using a photolithography technique to form a through-hole in the insulating film 39 and thereafter filling the through-hole with a conductor such as tungsten. When the mask position and the position of the bent portion 35 exactly match with each other in the photolithography process, the through-hole is positioned, and thus the contact plug 41 is formed, in the central portion of the bent portion 35, and the contact plug 41 is connected via the entire cross section of the contact plug 41. On the other hand, even when a displacement in the positioning occurs during the photolithography process, the bent portion 35 is formed to have a wider area than the width of the element region 33, and therefore, it is possible to prevent from decreasing the connection area of the contact portion of the contact plug 41.

The cross section of the contact plug 41 in parallel with the surface of the semiconductor substrate 11 is ideally in a substantially square shape, one side of which has the minimum processing size F. However, the contact plug 41 may have a structure of a square frustum whose cross sectional area is smaller on the contact side of the bent portion 35 and is larger on the bit line 43 side on the upper side. Alternatively, the shape of the contact plug 41 may be a square pole shape, a body having a cross section in a rounded square shape, a body having a cross section in a substantially circular shape, and the like. Still alternatively, the contact plug 41 may have a structure in which a plurality of square frustums having a smaller cross sectional area on the lower side are stacked and connected in a vertical direction in order.

The contact plugs 41 are disposed at regular intervals in the word line direction 23 in the same manner as the arrangement of the bent portions 35. A center-to-center distance between the adjacent contact plugs 41 may be, for example, about 1.4 times larger than twice of the minimum processing size F.

Next, a structure of a bent back section 49 of the word line 37 and the select gate line 38 and a structure around the bent back section 49 will be explained with reference to FIG. 3. FIG. 3 shows a portion of the memory array corresponding to the region A2 of FIG. 1. The word line 37 and the select gate line 38 straightly extend along the word line direction 23, and are bent back in the array adjustment region 25 so as to be in symmetrical with respect to a bent back section 49 along the element region direction 21. The word lines 37 and the select gate lines 38 arranged in parallel with each other are in a zigzag shape (polygonal line indicated by the arrow in FIG. 1) by way of the plurality of bent back sections 49. The ends of the word lines 37 and the select gate lines 38 in the row direction are connected to the row circuit 15

The array adjustment region 25 is, for example, the element isolation region 31 and the element region 33 located between the adjacent memory cell regions 13 (see FIG. 1). The array adjustment region 25 (which may also be referred to as shunt region) also serves as, for example, a region used to arrange contact holes and wirings, not shown, to apply the potential of the semiconductor substrate 11 formed with the P-type well region of the memory cell region 13. The NAND strings included in the array adjustment region 25 are dummies, and do not work as memory cells. As a result, the word lines 37 and the select gate lines 38 can be bent back without increasing the area of the chip.

The element regions of the adjacent NAND strings 27 sharing a source line (not shown) and straightly extending are shifted at the bent portion 35 in the right or left directions by the minimum processing size F. In other words, the element region corresponding to the NAND string 27 of the left half of the bent back section 49 is shifted at the bent portion 35 to the right by the minimum processing size F, when seen from upper side to lower side in FIG. 3, and the region corresponding to the NAND string 27 of the right half on the opposite side is shifted at the bent portion 35 to the left by the minimum processing size F.

As described above, the semiconductor memory device 1 according to the embodiment has the bent portion 35 made of the diffusion region 36. The element region 33a is shifted at this bent portion 35 in the row direction by the distance half of the length L, and extends from this bent portion 35 in the opposite direction from each other along the element direction 21. This bent portion 35 is a part of the element region 33a, and has the straight line portion 34 having the minimum processing size. Likewise, the adjacent element regions 33b, 33c are also provided with the bent portions 35.

These bent portions 35 are disposed along the word line direction 23, and are arranged between the adjacent select gate lines 38. The select transistor 46 is constituted by the select gate line (gate electrode) 38 and the diffusion region 36. The diffusion region 36 is connected to the bit line 43 on the insulating film 39 via the contact plug 41. On the opposite side of the bent portion 35 with respect to the select gate line 38, the plurality of word lines 37 are arranged in parallel with the select gate lines 38 in the word line direction 23.

In the semiconductor memory device 1, the element isolation region 31 and the element region 33 except for the bent portion 35 and the word lines 37 can be formed with the straight L/S of the minimum processing size F. Therefore, as compared with a case where a widened area having a size equal to or a size less than the minimum processing size F in the middle of the straight element region, the element separation region 31 and the element region 33 can stably be formed in the semiconductor memory device 1. In other words, the semiconductor memory device 1 according to the embodiment achieves a high reproducibility and can suppress the decrease in production yield.

In the semiconductor memory device 1 according to the embodiment, the size of the area in which the diffusion layer region 36 of the bent portion 35 is connected to the contact plug 41 is larger. Therefore, as compared with a conventional straight element region, the semiconductor memory device 1 can better suppress the decrease of the contact area of the contact plug 41 and suppress the increase of the contact resistance even when the displacement in the arrangement occurs. Since the adjacent contact plugs 41 are separated by the distance of about 2.8 times the minimum processing size F, the semiconductor memory device 1 reduces the frequency the contact plugs 41 come in contact or proximity, and improves the breakdown voltage deterioration of the adjacent NAND strings 27.

Since the semiconductor memory device 1 has the word lines 37 and the select gate lines 38 that are arranged in parallel with the arrangement direction of the contact plugs 41, the memory cells 45 and the select transistors 46 of each of the NAND strings 27 can suppress variation of the parasitic resistance caused by the difference in the distance from the contact plug 41. The embodiment can provide the semiconductor memory device having the element regions arranged in parallel at the width of the minimum processing size and capable of suppressing the contact resistance.

Figure 4:
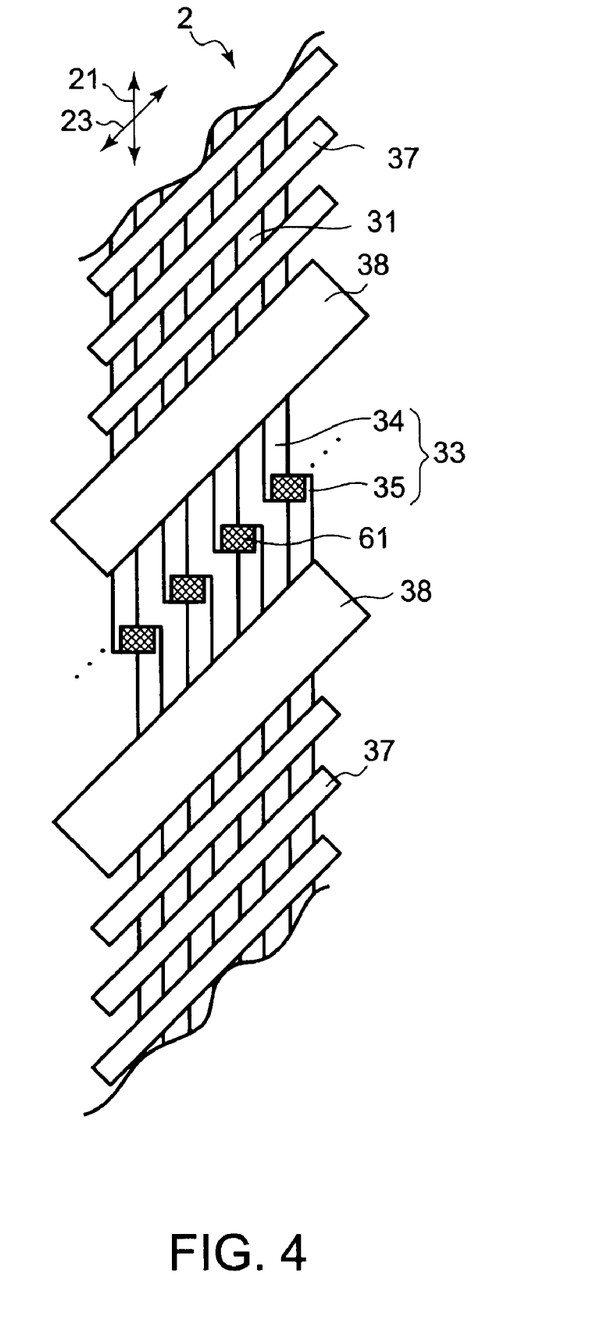
FIG. 4 is a plan view schematically showing a structure of a memory cell region of a semiconductor memory device according to a modification of the first embodiment of the invention.

Next, a modification of the first embodiment will be described with reference to FIG. 4. FIG. 4 is a figure corresponding to FIG. 2A. The modification is different from the semiconductor memory device 1 according to the first embodiment in that the cross section of the contact plug is larger in the lengthwise direction (row direction) of the bent portion 35.

As shown in FIG. 4, a contact plug 61 is formed longer in the row direction than the contact plug 41 of the semiconductor memory device 1 according to the first embodiment, in a manner that the length of the contact plug 61 does not exceed the length of the bent portion 35 in the row direction. For example, the contact plug 61 is formed about 1.5 times longer. The width of the contact plug 61 in the element region direction 21 is the same as the contact plug 41, and therefore, the contact plug 61 can have a larger connection area with the bent portion 35. The modification is the same as the semiconductor memory device 1 according to the first embodiment except for the cross sectional shape of the contact plug 61.

The semiconductor memory device 1 according to the modification achieves the effects achieved by the first embodiment, and in addition, the connection area between the contact plug 61 and the bent portion 35 becomes larger, which can reduce the contact resistance. Further, even if a displacement of the arrangement occurs, it is possible to suppress the decrease of the contact area, and accordingly suppress the increase of the contact resistance.

Second Embodiment

A semiconductor memory device according to the second embodiment of the invention will be hereinafter described with reference to FIG. 5. The semiconductor memory device according to the second embodiment is different from the semiconductor memory device 1 according to the first embodiment in that the semiconductor memory device according to the second embodiment has larger bent sections. It should be noted that the same reference numerals are assigned to the same constituent elements as the first embodiment, and the description of the same elements is not repeated.

Figure 5:
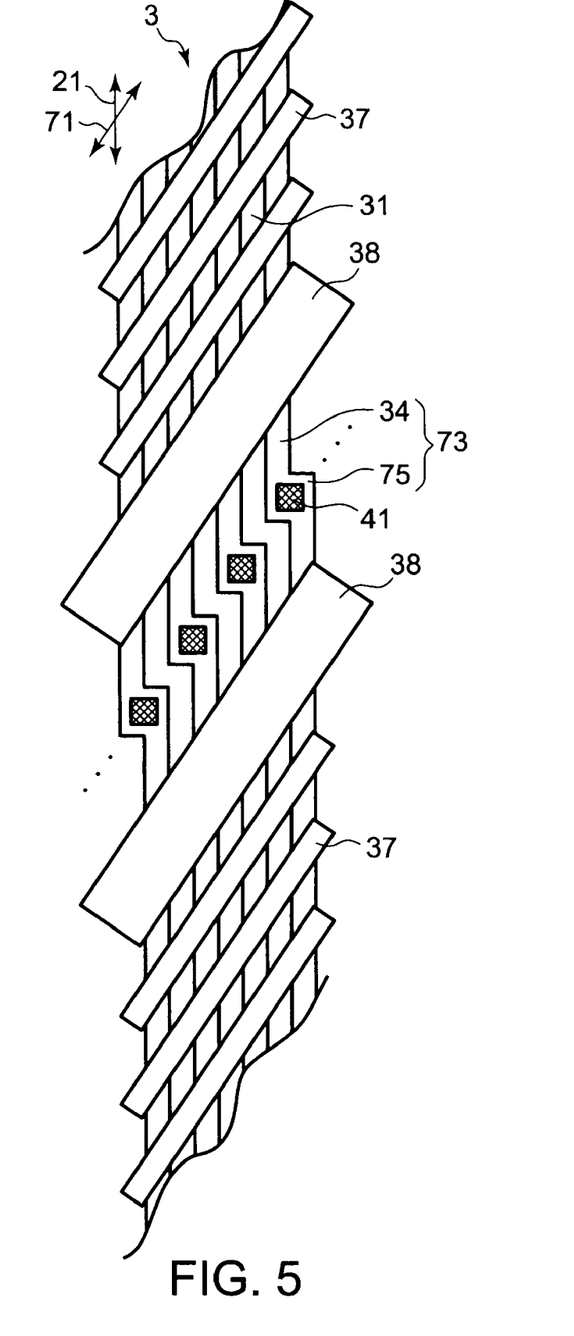
FIG. 5 is a plan view schematically showing a structure of a memory cell region of a semiconductor memory device according to a second embodiment of the invention.

As shown in FIG. 5, in a semiconductor memory device 3, a bent portion 75 of a element region 73 is made wider by the minimum processing size F in the element region direction 21 than the bent portion 35 of the first embodiment. The length of the bent section in the row direction is twice the minimum processing size F, which is the same as that of the bent portion 35 according to the first embodiment. The width of the bent portion 75 in the element region direction 21 is also twice the minimum processing size F. Since the width of the bent portion 75 is twice the minimum processing size F, it is easy to bring the bent portion 75 and the contact plug 41 into contact with each other even when the positional displacement in the widthwise direction of the bent portion 75 occurs. Since the bent portion 75 is widened in the length and width directions, it is easy to bring the bent portion 75 and the contact plug 41 into contact despite the positional displacements in both directions.

A element isolation region 31 is formed so that the element regions 73 are disposed to be spaced apart by the minimum processing size F. As a result, the arrangement direction of the bent portion 75 becomes a word line direction 71 having an inclination closer to the element region direction 21 than the word line direction 23 according to the first embodiment. The angle between the element region direction 21 and the word line direction 71 is about 34 degrees, for example.

A straight line portion 34 of the element region 73 is arranged along the element region direction 21 in the same manner as the first embodiment. However, a word line 37 and a select gate line 38 are disposed along the word line direction 71. A plurality of word lines 37 are spaced apart from each other by the minimum processing size F and are arranged in parallel. However, the interval between the word line 37 and the select gate line 38 may be formed to be wider than the minimum processing size F. Since the contact plug 41 is disposed in the central portion of the bent portion 75, the contact plugs 41 as well as the bent sections 75 are disposed along the word line direction 71. The interval of the adjacent contact plugs 41 is larger than the interval of the adjacent contact plugs 41 according to the first embodiment.

The semiconductor memory device 3 achieves the effects of the semiconductor memory device 1 according to the first embodiment. In addition, the bent portion 75 with respect to the contact plug 41 is larger, which further reduces the frequency of positional displacement. In other words, it is easier to ensure the contact area, and as a result, the increase of the contact resistance can be prevented, and the contact resistance can be further stabilized.

It should be noted that the embodiment may be modified and embodied such that the cross section of the contact plug is made larger to allow a larger contact area (not shown in the figure) as explained in the modification of the first embodiment. In the modification of the first embodiment, the contact plug is made larger in the direction perpendicular to the element region direction 21 (row direction), but in the modification of the second embodiment, the contact plug may also be made larger in the direction of the element region direction 21 (column direction).

Third Embodiment

Figure 6:
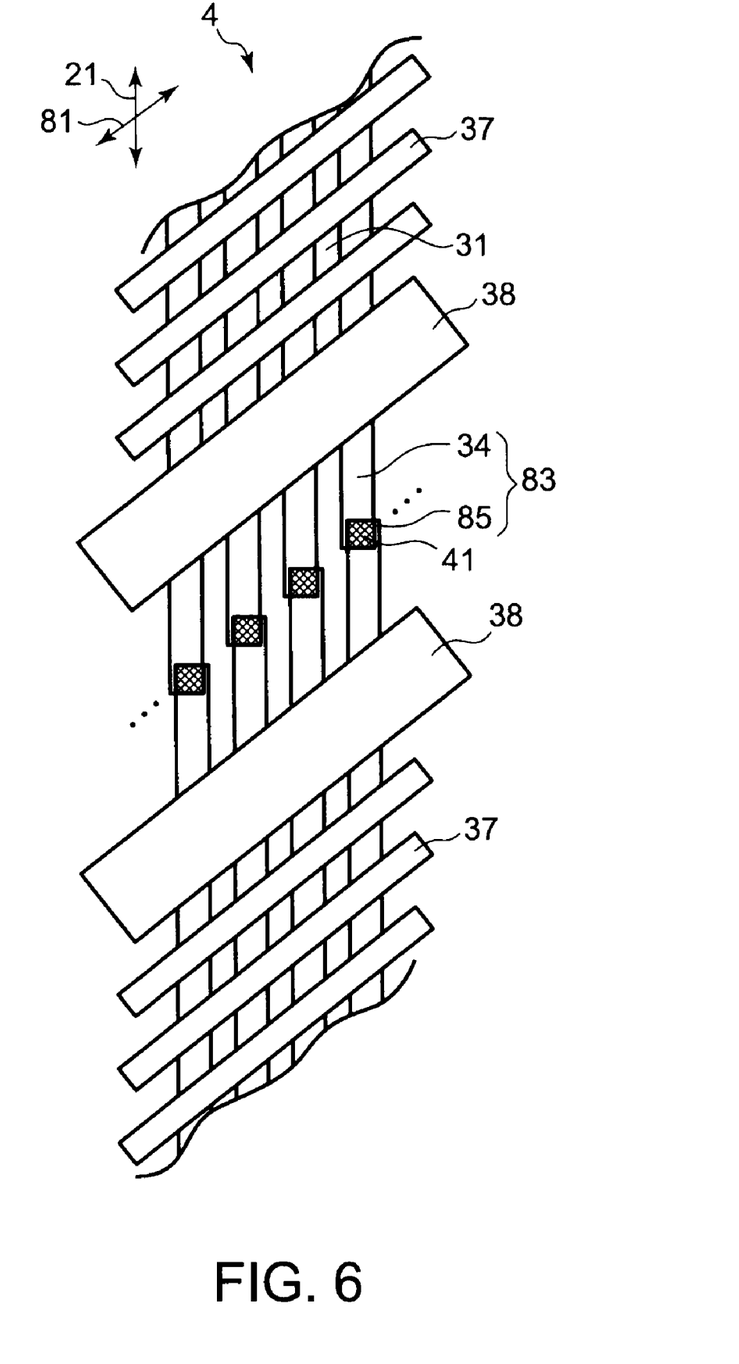
FIG. 6 is a plan view schematically showing a structure of a memory cell region of a semiconductor memory device according to a third embodiment of the invention.

A semiconductor memory device 4 according to the third embodiment of the invention will be hereinafter described with reference to FIG. 6. FIG. 6 is a figure corresponding to FIG. 2A. The semiconductor memory device 4 according to the third embodiment is different from the semiconductor memory device 1 according to the first embodiment in that the size of the bent section is made smaller. It should be noted that the same reference numerals are assigned to the same constituent elements as the first and second embodiments, and the description the same elements is not repeated.

As shown in FIG. 6, in a semiconductor memory device 4, a bent portion 85 of an element region 83 is made wider than the bent portion 35 according to the first embodiment in the row direction by an amount not larger than the minimum processing size F. For example, the bent portion 85 may be widened by about 20% of the minimum processing size F. The length of the bent portion 85 in the row direction is smaller than that of the bent portion 35 according to the first embodiment.

A element separation region 31 is formed such that the element regions 83 are disposed to be spaced apart by the minimum processing size F. As a result, the arrangement direction of the bent portion 85 becomes a word line direction 81 having an inclination away from the element region direction 21 than the word line direction 23 according to the first embodiment. The angle between the element region direction 21 and the word line direction 81 can be about 50 degrees or more, for example.

A straight line portion 34 of the element region 83 is arranged along the element region direction 21 in the same manner as the first embodiment. However, a word line 37 and a select gate line 38 are spaced apart from each other by the minimum processing size F to be arranged along the word line direction 81 in parallel. Since the contact plug 41 is disposed in the central portion of the bent portion 85, the contact plug 41 as well as the bent portion 85 are arranged along the word line direction 81. The interval between the adjacent contact plugs 41 is less than the interval of the contact plugs 41 according to the first embodiment, but is larger than the minimum processing size F.

The effects of the semiconductor memory device 4 are that the word lines 37 and the select gate lines 38 along the word line direction 81 are arranged in a direction closer to a direction perpendicular to the element region direction 21, and accordingly, the semiconductor memory device 4 can reduce the area occupied by the memory cell region 13.

In each embodiment, an example in which the bit line is assumed to have a plan shape that is substantially the same as the element region is described. Alternatively, the bit line may be made in a shape that does not have any bent section in a straight direction connecting the contact plugs.

The present invention is not limited directly to the above described embodiments. In practice, the structural elements can be modified without departing from the spirit of the invention. Various inventions can be made by properly combining the structural elements disclosed in the embodiments. For example, some structural elements may be omitted from all the structural elements disclosed in the embodiments. Furthermore, structural elements in different embodiments may properly be combined. It is to therefore be understood that within the scope of the appended claims, the present invention may be practiced other than as specifically disclosed herein.

What is claimed is:

1. A semiconductor memory device comprising:
a semiconductor substrate;
a first element region disposed on the semiconductor substrate including;
  a first bent portion formed of a rectangular region, and
  a pair of first straight line portions connected to opposite both ends of the first bent portion respectively, extending in an opposite direction each other along a first direction, a width of the pair of first straight line portions being less than the width of the first bent portion;
a second element region disposed on the semiconductor substrate including;
  a second bent portion formed of a rectangular region, and
  a pair of second straight line portions connected to opposite both ends of the second bent portion respectively, extending in an opposite direction each other along the first direction, and
  wherein a width of the pair of second straight line portions being less than the width of the second bent portion, and the first and second element regions are disposed so as to interpose an element isolation region having Feature Size Line Space therebetween, and the first and second bent portions are disposed along a second direction with an acute angle with respect to the first direction;
contact plugs connected to respective first and second bent portions;
first and second select transistors disposed in the first and second element regions respectively, adjacent to the contact plugs;
select gate lines connected to the first and second select transistors extending in the second direction; and a plurality of word lines commonly connected to the memory cells in the first and second element regions, the word lines extending in the second direction in parallel with the select gate lines on an opposite side of the bent portion with respect to the select gate line.

2. The semiconductor memory device according to claim 1, wherein the pair of straight line portions of the first and second element regions are formed with Feature Size Line Space respectively.

3. The semiconductor memory device according to claim 1, wherein the respective length of the first and second bent portions are set so that the length is less than twice the width of the first and second element regions.

4. The semiconductor memory device according to claim 1, wherein the lines of the first direction and the second direction intersect with each other at an angle of 45 degrees.

5. The semiconductor memory device according to claim 1, wherein the word lines and the select gate lines are bent back at an array adjustment region which is part of a memory cell array including memory cells, in a symmetrical manner with respect to a plane along the first direction.

6. The semiconductor memory device according to claim 5, wherein the memory cell array includes a dummy memory array region, and the memory adjustment region is part of the dummy memory array region including dummy memory cells that does not serve as a memory.

7. The semiconductor memory device according to claim 1, the width of the first and second bend portions is less than twice the respective width of the first and second element regions.

8. The semiconductor memory device according to claim 1, wherein the lines of the first direction and the second direction intersect with each other at an angle of over 30 degrees.

9. The semiconductor memory device according to claim 1, wherein a longitudinal edge of the first and second rectangular bent portions are arranged so that the longitudinal edges of the bent portions are perpendicular to the first direction.

10. The semiconductor memory device according to claim 1, wherein the contact plug is connected to the bit line.

11. A semiconductor memory device comprising:
a semiconductor substrate;
a first element region disposed on the semiconductor substrate including;
a first bent portion formed of a rectangular region, and
a pair of first straight line portions connected to opposite both ends of the first bent portion respectively, extending in an opposite direction each other along a first direction, a width of the pair of first straight line portions is less than the width of the first bent portion;
a second element region disposed on the semiconductor substrate including;
a second bent portion formed of a rectangular region, and
a pair of second straight line portions connected to opposite both ends of the second bent portion respectively, extending in an opposite direction each other along the first direction, and
wherein a width of the pair of second straight line portions is less than the width of the second bent portion, and the first and second element regions are disposed so as to interpose an element isolation region having Feature Size Line Space therebetween, and the first and second bent portions are disposed along a second direction with an acute angle with respect to the first direction;
contact plugs connected to respective first and second bent portions;
first and second select transistors disposed in the first and second element regions, adjacent to the contact plugs;
a select gate line connected to the first and second select transistors extending in the second direction;
first and second NAND memory cells disposed in the first and second element regions respectively, each of the NAND memory cells including a plurality of non-volatile memory cells connected in series, and one terminal of the NAND memory cells being commonly connected to the select gate line;
a source line commonly connected to the other terminal of the NAND memory cells; and
a plurality of word lines commonly connected to the memory cells in the first and second element regions, the word lines extending in the second direction in parallel with the select gate lines in an opposite side of the bent portion with respect to the select gate line.

12. The semiconductor memory device according to claim 11, wherein the source line is connected to a common source line.

13. The semiconductor memory device according to claim 11, wherein the pair of straight line portions of the first and second element regions are formed with Feature Size Line Space.

14. The semiconductor memory device according to claim 11, wherein the word lines and the select gate lines are bent back at an array adjustment region, which is part of a memory array including memory cells, in a symmetrical manner with respect to a plane along the first direction.

15. The semiconductor memory device according to claim 11, wherein the contact plug is connected to the bit line.

16. The semiconductor memory device according to claim 11, wherein the semiconductor memory device further comprises a plurality of memory units, each including the select gate lines and the NAND memory cells, the select gate lines of the adjacent memory units are disposed adjacent each other, and the bent portions are arranged between the gate select lines.

17. The semiconductor memory device according to claim 14, wherein a space in a triangle shape is disposed at an end portion of the memory array, and a column circuit is disposed in the space.

* * * * *